(12) United States Patent
Liu

(10) Patent No.: US 10,312,376 B2
(45) Date of Patent: Jun. 4, 2019

(54) THIN FILM TRANSISTOR AND METHOD FOR MANUFACTURING THE SAME

(71) Applicant: Shenzhen China Star Optoelectronics Technology Co., Ltd., Shenzhen, Guangdong (CN)

(72) Inventor: Yang Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 143 days.

(21) Appl. No.: 15/128,202

(22) PCT Filed: Aug. 11, 2016

(86) PCT No.: PCT/CN2016/094682
§ 371 (c)(1),
(2) Date: Sep. 22, 2016

(87) PCT Pub. No.: WO2018/014385
PCT Pub. Date: Jan. 25, 2018

(65) Prior Publication Data
US 2018/0219103 A1  Aug. 2, 2018

(30) Foreign Application Priority Data

Jul. 20, 2016 (CN) .......................... 2016 1 0571403

(51) Int. Cl.
*H01L 29/04* (2006.01)
*H01L 27/12* (2006.01)
(Continued)

(52) U.S. Cl.
CPC ........ *H01L 29/78696* (2013.01); *H01L 21/77* (2013.01); *H01L 27/1214* (2013.01);
(Continued)

(58) Field of Classification Search
CPC ..... H01L 27/124; H01L 27/13; G02F 1/1393; G02F 1/136213; G09G 3/3648; G09G 2320/0223; G09G 2320/0219
See application file for complete search history.

(56) References Cited

U.S. PATENT DOCUMENTS 6,476,418 B1    11/2002  Shiga
2007/0187687 A1  8/2007  Liou
2016/0056184 A1*  2/2016  Wei ..................... H01L 27/1255
                                                                257/43

FOREIGN PATENT DOCUMENTS

CN    103594521 A    2/2004
CN    103489921 A    1/2014
(Continued)

*Primary Examiner* — Brian Turner
(74) *Attorney, Agent, or Firm* — Andrew C. Cheng

(57) ABSTRACT

The present provides a thin film transistor, which comprises: a gate on the substrate; a gate insulating layer; the embossed portion defining a first end in which a first active layer is formed, and a second end in which a second active layer is formed; a first source connected to the first active layer and a second source connected to the second active layer; a passivation layer; a first through hole and a second through hole defined in the passivation layer; and a drain formed on the passivation layer and extending through the first and second through hole to interconnect the first and second active layers, respectively. By this arrangement, a first distance defined between the drain with respect to a first contact surface of the first source layer located on the flattened portion of the embossed portion will equal to the height of the embossed portion. In addition, a second distance defined between the drain with respect to a second contact surface of the second source layer located on the flattened portion of the embossed portion will equal to the height of the embossed portion as well. By implementation of the technology provided by the present invention, a thin (Continued)

film transistor of shortened channel can be realized such that the thin film transistor is benefited with a larger aspect ratio so as to entertain a larger on-state current.

16 Claims, 3 Drawing Sheets

(51) Int. Cl.
*H01L 29/786* (2006.01)
*H01L 21/28* (2006.01)
*H01L 29/66* (2006.01)
*H01L 21/77* (2017.01)
*H01L 29/08* (2006.01)
*H01L 29/10* (2006.01)
*H01L 29/417* (2006.01)
*H01L 29/423* (2006.01)

(52) U.S. Cl.
CPC ...... *H01L 29/0847* (2013.01); *H01L 29/1037* (2013.01); *H01L 29/41733* (2013.01); *H01L 29/42384* (2013.01); *H01L 29/66742* (2013.01); *H01L 29/66969* (2013.01); *H01L 29/7869* (2013.01); *H01L 29/78618* (2013.01); *H01L 29/78642* (2013.01)

(56) References Cited

FOREIGN PATENT DOCUMENTS

| | | |
|---|---|---|
| CN | 103594521 A | 2/2014 |
| CN | 104392999 A | 3/2015 |
| CN | 105185839 A | 12/2015 |
| CN | 105810691 A | 7/2016 |
| JP | 2006339265 A | 12/2006 |

\* cited by examiner

THIN FILM TRANSISTOR AND METHOD FOR MANUFACTURING THE SAME

FIELD OF THE INVENTION

The present invention relates to a technology of liquid crystal display (LCD), and more particularly, to a short-channeled LCD and a method for manufacturing the same.

DESCRIPTION OF PRIOR ART

Metal oxide semiconductor thin film transistor is considered a key technology in the next generation of flat panel display because of its good performance and lower manufacturing costs. However, with the increased requirements of the performance of display devices, aspect ratio of channels in metal oxide semiconductor thin film transistor is pushed larger and larger. And the aspect ratio of channels determines the functional properties of the metal oxide semiconductor thin film transistor. With the width of the channel W is set to a certain value, shortening the length of channel L can make the metal oxide semiconductor thin film transistor has a larger aspect ratio, so as to have a higher on-state current.

However, in conventional manufacturing processes, the length of channel L is limited by photolithography process directly, so it is difficult to achieve the goal of shortening channel.

SUMMARY OF THE INVENTION

In order to resolve the problem encountered by the prior art, the present provides a thin film transistor, which comprises: a substrate; a gate on the substrate; a gate insulating layer covering the substrate and the gate creating an embossed portion in which the gate is located, and a flattened portion which contains only substrate; the embossed portion defining a first end in which a first active layer is formed, and a second end in which a second active layer is formed, wherein both the first and second active layers extends along a sidewall of the embossed portion to the flattened portion; a first source connected to the first active layer and a second source connected to the second active layer, which are interconnected to each other; a passivation layer covering the first active layer, the second active layer, the first source, the second source and gate insulating layer; a first through hole defined in the passivation layer exposing the first active layer, and a second through hole defined in the passivation layer exposing the second source layer; and a drain formed on the passivation layer and extending through the first and second through hole to interconnect the first and second active layers, respectively. By this arrangement, a first distance defined between the drain with respect to a first contact surface of the first source layer located on the flattened portion of the embossed portion will equal to the height of the embossed portion. In addition, a second distance defined between the drain with respect to a second contact surface of the second source layer located on the flattened portion of the embossed portion will equal to the height of the embossed portion as well.

Further, the first source is located on the first active layer extending to the flattened portion, and the second source is located on the second active layer extending to the flattened portion; and wherein the first and second through holes expose the first and second active layers located on the embossed portion.

Further, the first source is located on the first active layer on the embossed portion, and the second source is located on the second active layer on the embossed portion; and wherein the first and second through holes expose the first and second active layers located on the flattened portion.

Further, the first source is located between the flattened portion and the first active layer extending to the flattened portion, and the second source is located between the flattened portion and the second active layer extending to the flattened portion; and wherein the first and second through holes expose the first and second active layers located on the embossed portion.

Further, cross section of both the gate and the embossed portion are shapes of trapezoid and the sidewall of the embossed portion is oblique.

Further, the middle of the gate is embossed, and cross section of both which and the embossed portion are shapes of trapezoid and the sidewall of the embossed portion is oblique.

The present further provides a method of manufacturing a thin film transistor, which comprises: forming a gate on a substrate; forming a gate insulating layer covering the substrate and the gate creating an embossed portion in which the gate is located, and a flattened portion which contains only substrate; forming the embossed portion defining a first end in which a first active layer is formed, and a second end in which a second active layer is formed, wherein both the first and second active layers extends along a sidewall of the embossed portion to the flattened portion; forming a first source connected to the first active layer and forming a second source connected to the second active layer, which are interconnected to each other; forming a passivation layer covering the first active layer, the second active layer, the first source, the second source and gate insulating layer; forming a first through hole defined in the passivation layer exposing the first active layer, and a second through hole defined in the passivation layer exposing the second source layer; and forming a drain on the passivation layer and extending through the first and second through hole to interconnect the first and second active layers, respectively. By this arrangement, a first distance defined between the drain 7 with respect to a first contact surface of the first source layer 4a located on the flattened portion 32 of the embossed portion 31 will equal to the height of the embossed portion 31. In addition, a second distance defined between the drain 7 with respect to a second contact surface of the second source layer 4b located on the flattened portion 32 of the embossed portion 31 will equal to the height of the embossed portion 31 as well.

Further, a method of forming the first source and the second source comprises: forming the first source located on the first active layer extending to the flattened portion, and forming the second source located on the second active layer extending to the flattened portion; and a method of forming the first and second through holes comprises: forming the first and second through holes exposing the first and second active layers located on the embossed portion.

Further, the method of forming the first source and the second source comprises: forming the first source located on the first active layer on the embossed portion, and forming the second source located on the second active layer on the embossed portion; and the method of forming the first and second through holes comprises: forming the first and second through holes exposing the first and second active layers located on the flattened portion.

Further, the method of forming the first source and the second source comprises: forming the first source located between the flattened portion and the first active layer extending to the flattened portion, and forming the second source located between the flattened portion and the second active layer extending to the flattened portion; and the method of forming the first and second through holes comprises: forming the first and second through holes exposing the first and second active layers located on the embossed portion.

The advantages of the present invention: the present can ensure that the length of channel is determined by the sidewall length of gates by manufacturing a thin film transistor with a vertical structure. Comparing to the prior art, the length of channel of thin film transistor is controlled by a photolithography process. The length of channel of thin film transistor of the present invention is not affected by photolithography process, so a thin film transistor of shortened channel can be realized such that the thin film transistor is benefited with a larger aspect ratio so as to entertain a larger on-state current.

BRIEF DESCRIPTION OF DRAWINGS

Technical implementation will be described below clearly and fully by combining with drawings made in accordance with an embodiment in the present invention.

DESCRIPTION OF PREFERRED EMBODIMENT

Detailed description will be given by following description in order to fully understand the present invention. However, the present invention can be implemented in different from many other ways which described herein. Technical staff in this field can extend similarly without departing from the intention of the present invention. Therefore, the present invention is not limited to the particular embodiment disclosed below.

In attached figures, it should be noted that the dimensions, sizes of curtain portions, areas, layers have modified or exaggerated for better understanding. Numeral reference through different drawings represents the same element.

It should be noted that even that first and second are used to described different elements, however, those elements should not be limited by those terms used in describing them. These terms are merely used to distinguish one from another.

FIGS. 1a~1g are flow charts of a method of manufacturing a thin film transistor made in accordance with an embodiment of the present invention.

Figure 1A:
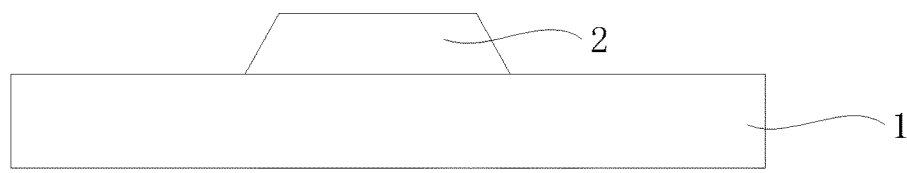
FIGS. 1a~1g are flow charts of a method of manufacturing a thin film transistor made in accordance with an embodiment of the present invention.
Figure 1B:
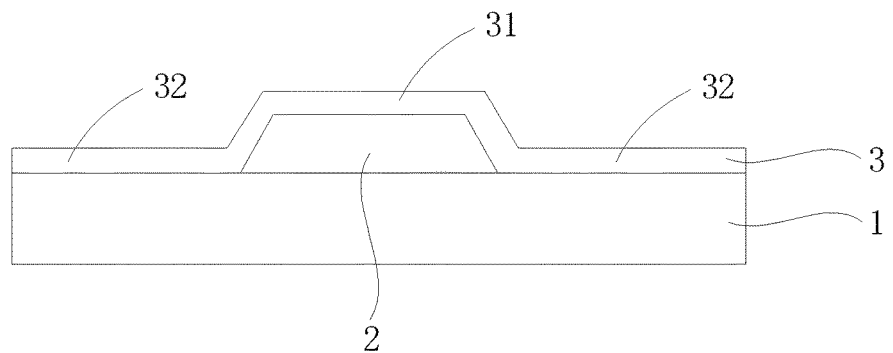

Referring to FIG. 1a, a gate 2 is formed on a substrate 1. According to the preferred embodiment, a cross section of the gate 2 has a shape of trapezoid. However, the present invention is not limited thereto. For example, such as illustrate in FIG. 2, the gate 2 has an embossed central portion, i.e. There is a vertical differential between the central portion and both ends, while the cross section of the gate 2 is still a shape of trapezoid.

In addition, the gate 2 can be made from the following material, such as aluminum, molybdenum, copper, silver, etc.

Figure 2:
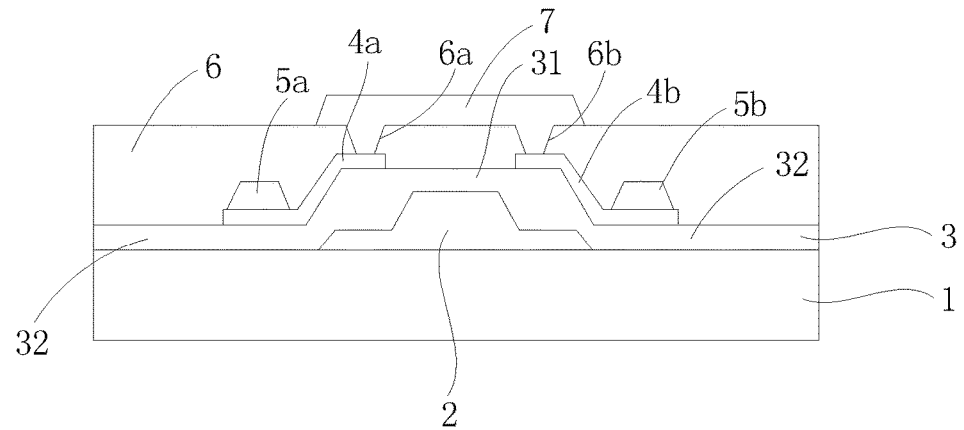
FIG. 2 is an illustrational view of a thin film transistor made in accordance to anther embodiment of the present invention.

Then, referring to FIG. 2, both the gate 2 and the substrate 1 are covered with a gate insulating layer 3. In this preferred embodiment, a portion of the gate insulating layer 3 covers the embossed central portion of the gate 2 so as to create an embossed portion 31, while the rest of the gate insulating layer 3 is leveled to define a flattened portion 32. In general, the flattened portion 32 is located on both sides of the embossed portion 31.

In addition, the gate insulating layer 3 can be made from the following material, such as silicon nitride, silicon oxide, aluminum oxide and other insulating materials.

Figure 1C:
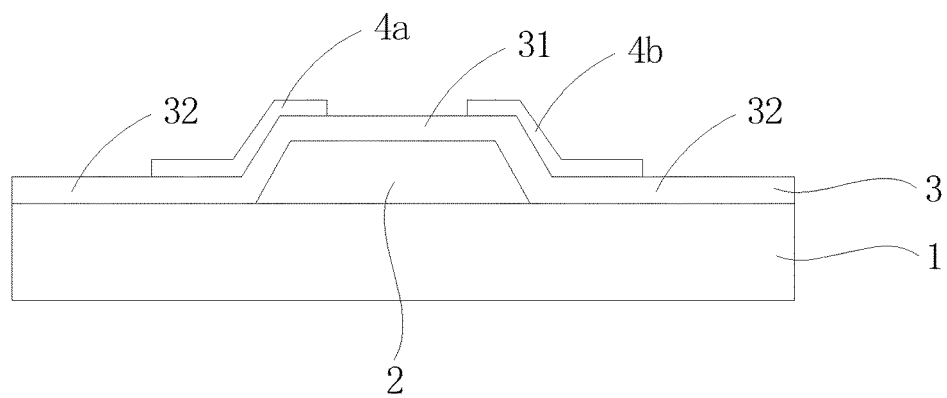

Referring to FIG. 1c, a first active layer 4a and a second active layer 4b are formed on first and second ends of the embossed portion 31, respectively. The first active layer 4a extends from a first sidewall of the embossed portion 31 to the flattened portion 32 located on the first side, and the second active layer 4b extends from a second sidewall of the embossed portion 31 to the flattened portion 32 located on the second side. Since the gate 2 has a shape of trapezoid, the embossed 31 inherits the same correspondingly as well.

Furthermore, the first active layer 4a and the second active layer 4b are distant with each other so as to expose the embossed portion 31. In addition, the first active layer 4a and the second active layer 4b can be made from the following material, such as zinc-oxide-based materials, indium-oxide-based materials, tin-dioxide-based materials or other metal oxide semiconductor materials.

Figure 1D:
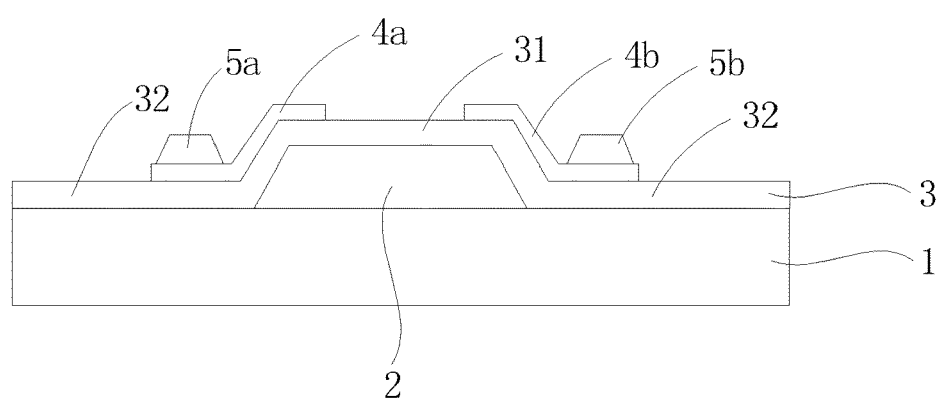

Referring to FIG. 1d, a first source 5a is formed on the flattened portion 32 located on the first side of the embossed portion 31, and a second source 5b is formed on the flattened portion 32 located on the second side of the embossed portion 31, and wherein the first and second sources 5a, 5b are adjoined with each other. According to one preferred embodiment, the first and second sources 5a, 5b can be formed integrally into a circular shape or a U-shaped configuration. By providing a promising interconnection between the first and second sources 5a, 5b, the voltage applied to both the first and second sources 5a, 5b can be stabilized.

Figure 3:
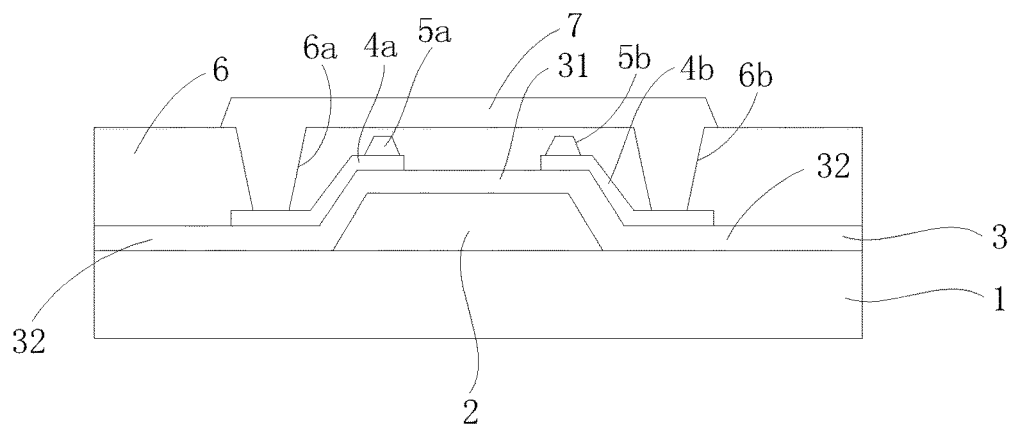
FIG. 3 is an illustrational view of a thin film transistor made in accordance to a further embodiment of the present invention.

Referring to FIG. 3, a further embodiment of the present invention. A first source 5a is formed on top of the first active layer 4a of the embossed portion 31. A second source 5b is formed on top of the second active layer 4b of the embossed portion 31. The first source 5a and the second source 5b are interconnected to each other.

Figure 4:
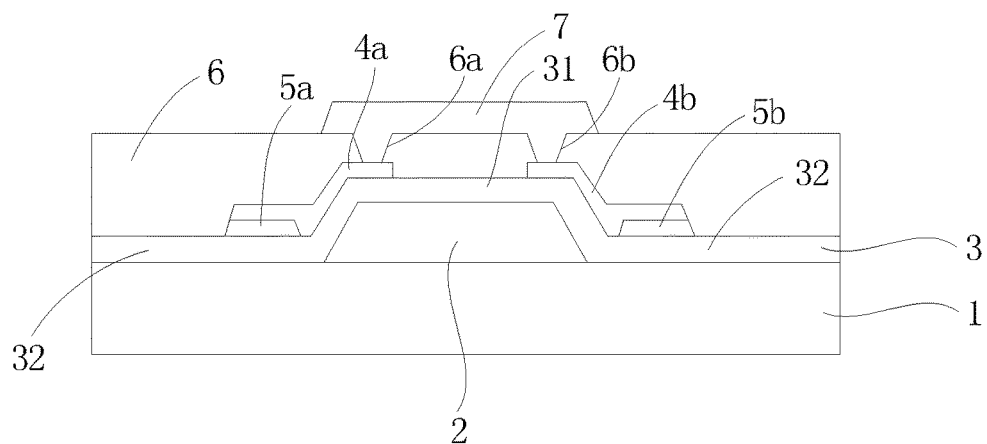
FIG. 4 is an illustrational view of a thin film transistor made in accordance to still a further embodiment of the present invention.

Referring to FIG. 4, another embodiment made in accordance with the present invention. A first source 5a is formed on the first side of the embossed portion 31. A second source 5b is formed on the second side of the embossed portion 31. Then, first and second active layers 4a, 4b are formed on both sides of the embossed portion 31, respectively. The first active layer 4a extends along a sidewall of the embossed portion 31 to the first source 5a, and the second active layer 4b extends along a sidewall of the embossed portion 31 to the second source 5b.

Figure 1E:
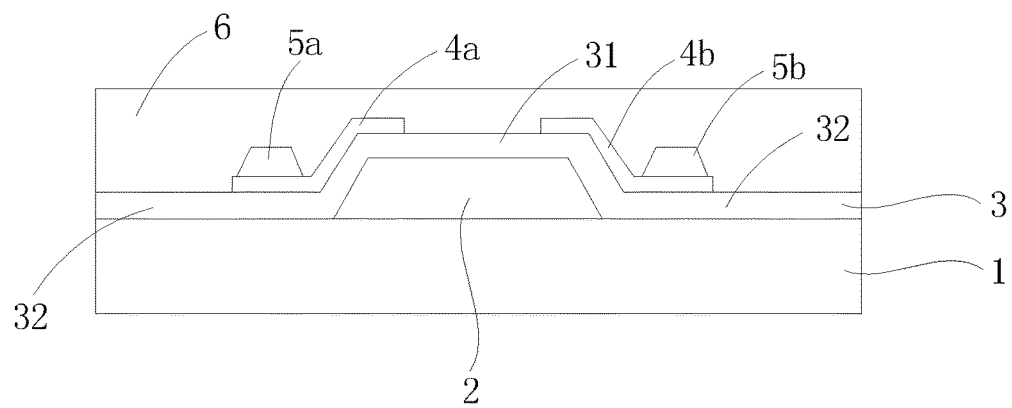

Referring to FIG. 1e, a passivation layer 6 is formed to cover the first active layer 4a, the second active layer 4b, the first source 5a, the second source 5b and gate insulating layer 3.

In addition, the passivation layer 6 can be made from the following material, such as silicon nitride, silicon oxide, aluminum oxide and other insulating materials.

Figure 1F:
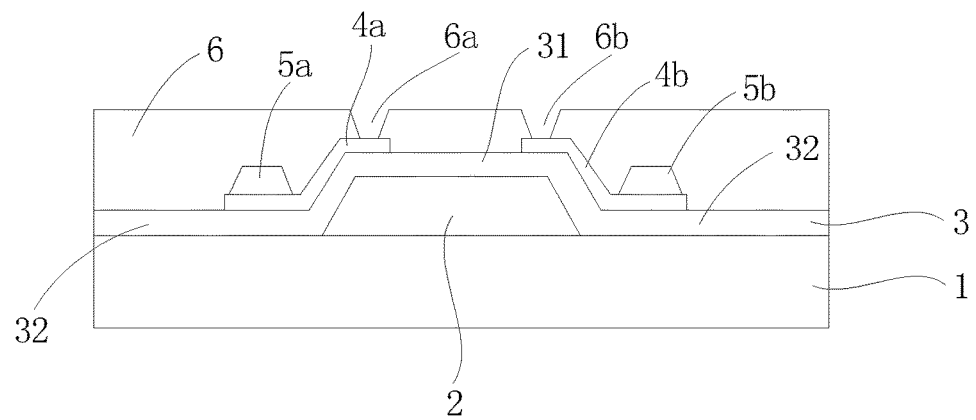

Referring to FIG. 1f, a first through hole 6a is defined in the passivation layer 6 to expose the first active layer 4a located on the embossed portion 31. A second through hole 6b is defined in the passivation layer 6 to expose the second active layer 4b located on the embossed portion 31. It should be noted that the positions of the first and second through holes 6a, 6b are also applicable to the positions of the first and second through holes 6a, 6b of the second embodiment such as disclosed in FIG. 4.

Referring to FIG. 3, another embodiment is disclosed. A first through hole 6a is defined in the passivation layer 6 to expose the first active layer 4a extending to the flattened portion 32 located on the first side of the embossed portion 31. A second through hole 6b is defined in the passivation layer 6 to expose the second active layer 4a extending to the flattened portion 32 located on the second side of the embossed portion 31.

Figure 1G:
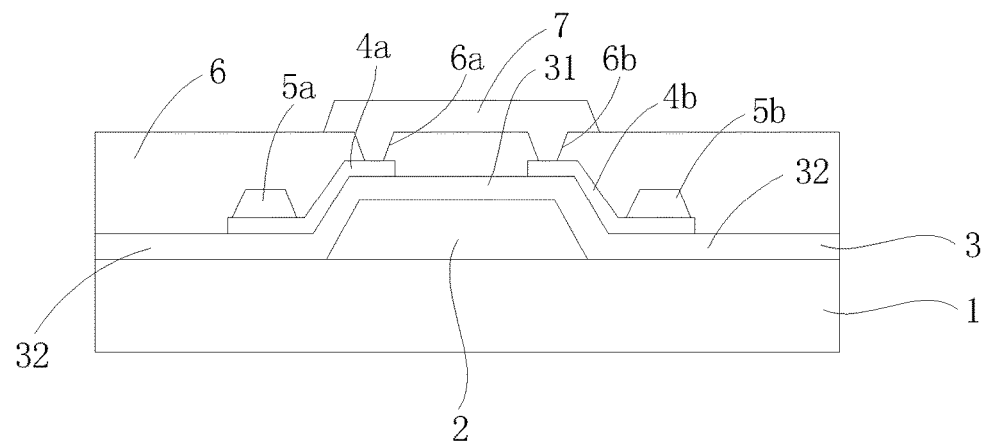

Finally, referring to FIG. 1g, a drain 7 is formed on the passivation layer 6. The drain 7 is interconnected, respectively, to the first and second active layers 4a, 4b through the first and second through holes 6a, 6b. By this arrangement, a first distance defined between a contact surface between the drain 7 and the first active layer 4a located on the embossed portion 31 and a contact surface between the first source 5a and the first active layer 4a located on the flattened portion 32 of the gate insulation layer 3 will equal to the height of the embossed portion 31. In addition, a second distance defined between a contact surface between the drain 7 and the second active layer 4b located on the embossed portion 31 and a contact surface between the second source 5b and the second active layer 5a located on the flattened portion 32 of the gate insulation layer 3 will equal to the height of the embossed portion 31 as well.

It should be noted that the position of the drain 7 disclosed in FIG. 1 is also applicable to the embodiment shown in FIG. 4, as substantially disclosed therein FIG. 4.

It should be noted that the drain 7 can be made with the indium tin oxide, indium zinc oxide and the equivalents. It should be noted that in the current embodiment, both the drain 7 and the pixel electrodes are made from the same material simultaneously.

Referring to FIG. 3, yet another embodiment of the present invention. A drain 7 is formed on a passivation layer 6. The drain 7 is interconnected to a first and second active layers 4a, 4b through a first and second through holes 6a, 6b, respectively.

In light of this, when a thin film transistor made in according to the present invention is in use, channels defined between the drain 7 and the first and second active layers 5a, 5b are configured by the first and second sources 4a, 4b located on the first and second side walls of the embossed portion 31, i.e. The length of the channel is defined by the length of the first and second sidewalls of the embossed portion 31. The length of the first and second sidewalls of the embossed portion 31 is in fact defined by the first and second sidewalls of the gate 2. As a result, by controlling the length of the first and second sidewalls of the gate 2, the length of the channels can be properly controlled accordingly.

In summary, by implementation of the technology provided by the present invention, a thin film transistor of shortened channel can be realized such that the thin film transistor is benefited with a larger aspect ratio so as to entertain a larger on-state current.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. A thin film transistor, comprising:
   a substrate;
   a gate on the substrate;
   a gate insulating layer covering the substrate and the gate creating an embossed portion in which the gate is located, and a flattened portion which contains only substrate;
   the embossed portion defining a first end in which a first active layer is formed, and a second end in which a second active layer is formed, wherein both the first and second active layers extends along a sidewall of the embossed portion to the flattened portion;
   a first source connected to the first active layer and a second source connected to the second active layer, which are interconnected to each other;
   a passivation layer covering the first active layer, the second active layer, the first source, the second source and gate insulating layer;
   a first through hole defined in the passivation layer exposing the first active layer, and a second through hole defined in the passivation layer exposing the second active layer; and
   a drain formed on the passivation layer and extending through the first and second through hole to interconnect the first and second active layers, respectively; a first distance defined between a contact surface between the drain a portion of the first active layer located on the embossed portion and a contact surface between the first source and a portion of the first active layer located on the fattened portion is equal to the height of the embossed portion, and a second distance defined between a contact surface between the drain and a portion of the second active layer located on the embossed portion and a contact surface between the second source and a portion of the second active layer located on the fattened portion is equal to the height of the embossed portion as well.

2. The thin film transistor as recited in claim 1, wherein the first source is located on the first active layer extending to the flattened portion, and the second source is located on the second active layer extending to the flattened portion; and wherein the first and second through holes expose the first and second active layers located on the embossed portion.

3. The thin film transistor as recited in claim 2, wherein cross section of both the gate and the embossed portion are shapes of trapezoid and the sidewall of the embossed portion is oblique.

4. The thin film transistor as recited in claim 2, the middle of the gate is embossed, and cross section of both which and the embossed portion are shapes of trapezoid and the sidewall of the embossed portion is oblique.

5. The thin film transistor as recited in claim 1, wherein the first source is located on the first active layer on the embossed portion, and the second source is located on the second active layer on the embossed portion; and wherein the first and second through holes expose the first and second active layers located on the flattened portion.

6. The thin film transistor as recited in claim 5, wherein cross section of both the gate and the embossed portion are shapes of trapezoid and the sidewall of the embossed portion is oblique.

7. The thin film transistor as recited in claim 5, the middle of the gate is embossed, and cross section of both which and the embossed portion are shapes of trapezoids and the sidewall of the embossed portion is oblique.

8. The thin film transistor as recited in claim 1, wherein the first source is located between the flattened portion and the first active layer extending to the flattened portion, and the second source is located between the flattened portion and the second active layer extending to the flattened portion; and wherein the first and second through holes expose the first and second active layers located on the embossed portion.

9. The thin film transistor as recited in claim 8, wherein cross section of both the gate and the embossed portion are shapes of trapezoid, and the sidewall of the embossed portion is oblique.

10. The thin film transistor as recited in claim 8, the middle of the gate is embossed, and cross section of both which and the embossed portion are shapes of trapezoid and the sidewall of the embossed portion is oblique.

11. The thin film transistor as recited in claim 1, wherein cross section of both the gate and the embossed portion are shapes of trapezoid and the sidewall of the embossed portion is oblique.

12. The thin film transistor as recited in claim 1, the middle of the gate is embossed, and cross section of both which and the embossed portion are shapes of trapezoid and the sidewall of the embossed portion is oblique.

13. A method of manufacturing a thin film transistor, comprising:
    forming a gate on a substrate;
    forming a gate insulating layer covering the substrate and the gate creating an embossed portion in which the gate is located, and a flattened portion which contains only substrate;
    forming the embossed portion defining a first end in which a first active layer is formed, and a second end in which a second active layer is formed, wherein both the first and second active layers extends along a sidewall of the embossed portion to the flattened portion;
    forming a first source connected to the first active layer and forming a second source connected to the second active layer, which are interconnected to each other;
    forming a passivation layer covering the first active layer, the second active layer, the first source, the second source and gate insulating layer;
    forming a first through hole defined in the passivation layer exposing the first active layer, and a second through hole defined in the passivation layer exposing the second active layer; and
    forming a drain on the passivation layer and extending through the first and second through hole to interconnect the first and second active layers, respectively; a first distance defined between a contact surface between the drain a portion of the first active layer located on the embossed portion and a contact surface between the first source and a portion of the first active layer located on the fattened portion is equal to the height of the embossed portion, and a second distance defined between a contact surface between the drain a portion of the second active layer located on the embossed portion and a contact surface between the second source and a portion of the second active layer located on the fattened portion is equal to the height of the embossed portion as well.

14. The method of manufacturing a thin film transistor recited in claim 5, wherein a method of forming the first source and the second source comprises: forming the first source located on the first active layer extending to the flattened portion, and forming the second source located on the second active layer extending to the flattened portion;
    and wherein a method of forming the first and second through holes comprises: forming the first and second through holes exposing the first and second active layers located on the embossed portion.

15. The method of manufacturing a thin film transistor recited in claim 5, wherein the method of forming the first source and the second source comprises: forming the first source located on the first active layer on the embossed portion, and forming the second source located on the second active layer on the embossed portion;
    and wherein the method of forming the first and second through holes comprises: forming the first and second through holes exposing the first and second active layers located on the flattened portion.

16. The method of manufacturing a thin film transistor recited in claim 5, wherein the method of forming the first source and the second source comprises: forming the first source located between the flattened portion and the first active layer extending to the flattened portion, and forming the second source located between the flattened portion and the second active layer extending to the flattened portion;
    and wherein the method of forming the first and second through holes comprises: forming the first and second through holes exposing the first and second active layers located on the embossed portion.

* * * * *